United States Patent [19]
Day

[11] 3,967,271
[45] June 29, 1976

[54] DIGITAL SHAFT ENCODER CIRCUIT FOR SCALES
[75] Inventor: Earl G. Day, Aurora, Ill.
[73] Assignee: Barber-Greene Company, Aurora, Ill.
[22] Filed: July 23, 1974
[21] Appl. No.: 491,101

[52] U.S. Cl. .................. 340/347 P; 177/DIG. 3; 177/DIG. 6; 235/151.33
[51] Int. Cl.² ....................................... H03K 13/00
[58] Field of Search ........ 340/347 P, 347 AD, 266; 235/92 MT, 151.33; 33/1 L; 177/3, DIG. 3, DIG. 6

[56] References Cited
UNITED STATES PATENTS

| | | | |
|---|---|---|---|
| 3,582,619 | 6/1971 | Orr et al. | 235/92 |
| 3,653,015 | 3/1972 | Rock | 340/204 |
| 3,705,400 | 12/1972 | Cordes, Jr. | 340/347 R |
| 3,746,842 | 7/1973 | Fowler | 235/92 CV |
| 3,826,318 | 7/1974 | Baumgartner | 177/25 |

Primary Examiner—Charles D. Miller
Attorney, Agent, or Firm—McDougall, Hersh & Scott

[57] ABSTRACT

An optical shaft encoder is mounted on a mechanical scale with direct coupling between the encoder and the scale pointer. The shaft encoder generates an up or down pulse train, depending on the direction of rotation of the scale shaft. The pulse train is shaped and decoded to determine the direction of rotation. The pulses are then multiplied and/or divided as necessary to provide range scaling for a given scale capacity. The range scaled pulse train then drives a binary tally counter and a BCD counter. The BCD counter output is utilized to produce a selected number of extra pulses which are added or subtracted from the tally counter. The BCD counter corrects for a scale shaft rotation of less than 360° between zero and a full scale reading. The output from the tally counters are provided to a set of seven-segment decimal counters. These counters produce outputs used to drive digital displays.

16 Claims, 12 Drawing Figures

DIGITAL SHAFT ENCODER CIRCUIT FOR SCALES

BACKGROUND OF THE INVENTION

This invention relates to electronic circuits for converting an analogue measurement for digital readout and transmission. More particularly, it relates to providing a circuit capable of converting a scale reading of a mechanical scale into an electronic data bit stream which can be utilized for digital displays and is suitable for use by a general purpose computer.

In asphalt, cement and similar plants, mechanical scales are present on large towers which dispense the materials into trucks for dispatching to a job site. The quantity of material is determined by the mechanical scales. Such scales are difficult to read and are remote from a central plant control. Further, it is necessary to have a scale reader present to accurately record the values of materials which are loaded onto the trucks.

In order to eliminate the need for a scale reader and further, in order to provide the data in a form which can be transmitted relatively long distances and over inexpensive transmission lines in a noisy environment, a circuit for encoding the weight data is desirable. It will be apparent that there are many other applications for the circuit of the present invention as for example, truck weight stations. In fact, as will become apparent from the specification, the present invention provides an advantageous means of transmitting digitized data relating to the rotation of any mechanical device where such movement indicates useful information.

It is accordingly an object of the present invention to provide a digital shaft encoder circuit for rotational devices which can convert the mechanical rotation of the device into digital information.

It is a further object of the present invention to provide a shaft encoder circuit for digitizing signals from a mechanical scale.

It is yet another object of the present invention to provide a circuit for encoding data for transmission over relatively long distances.

Other objects and advantages of the invention will become apparent from the remaining portion of the specification.

SUMMARY OF THE INVENTION

According to one embodiment of the invention, a circuit for encoding the amount and direction of rotation of a rotating device such as a scale is disclosed. The rotation of the scale shaft is detected by an optical shaft encoder device which generates electrical pulse trains in response to the rotation of the shaft. Decoding means are provided for examining these pulse trains to determine the direction of rotation. After this decoding, the pulse train is range scaled to account for the particular weight capacity of a given scale. After range scaling, the pulse train is provided to a tally counter and to a circuit for dial scaling. The dial scaling circuit compensates for scale rotation of less than 360° by adding a predetermined number of extra pulses to the tally counter.

The tally counter registers the number of pulses which are then converted from parallel to serial form suitable for use by a digital computer and in a digital display preferably of the seven-segment Numatron type.

DETAILED DESCRIPTION

Figures 1, 2, 2A:
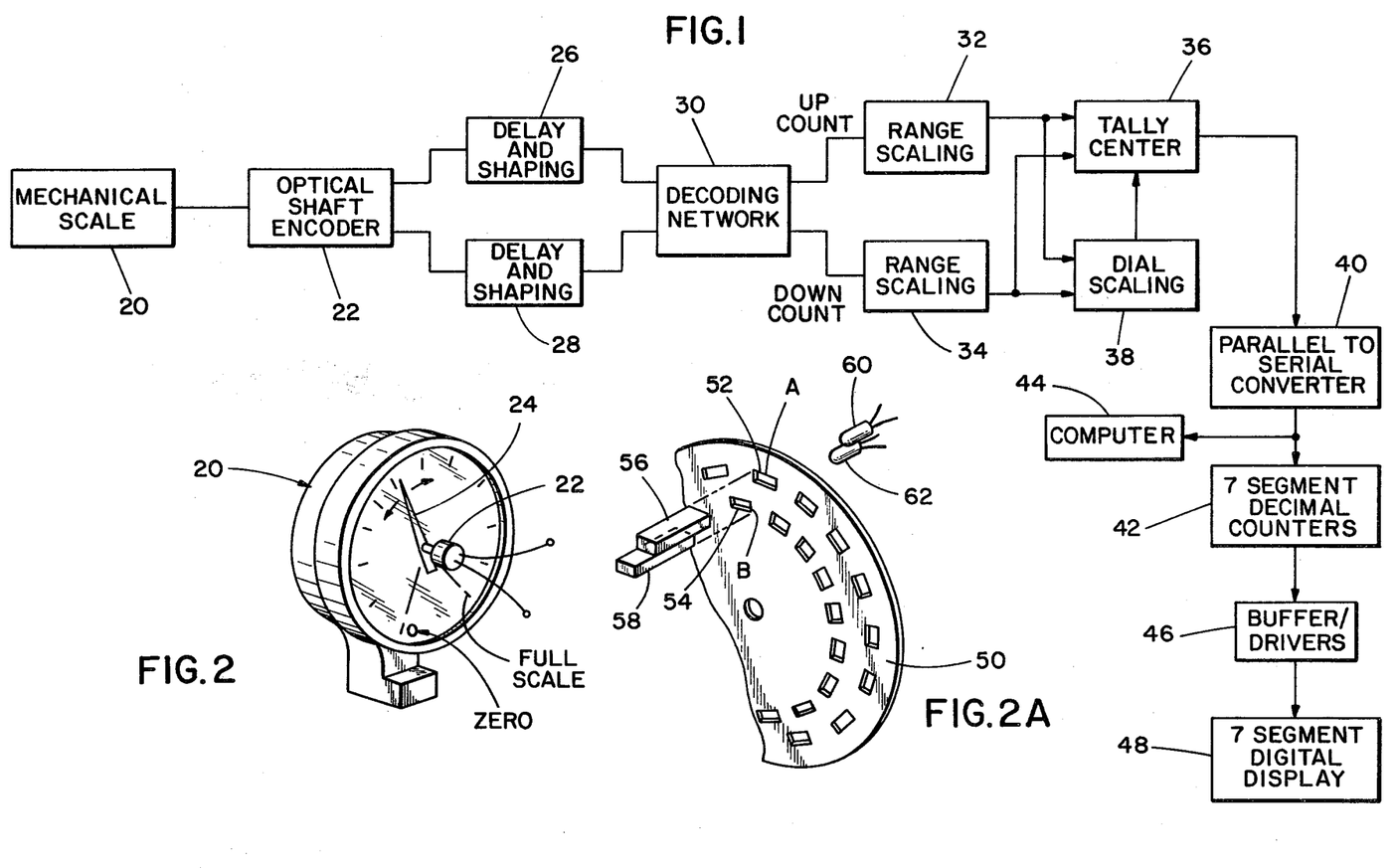
FIG. 1 is a block diagram of the digital shaft encoder circuit according to the present invention.
FIG. 2 is a perspective view of a mechanical weigh scale for which the present circuit is adapted.
FIG. 2A is a schematic drawing of the arrangement of the optical shaft encoder which produces an electrical pulse train when coupled to a rotating mechanical shaft.

Referring to FIG. 1, a block diagram of the invention is illustrated. A mechanical scale 20 of the type illustrated in FIG. 2 has an optical shaft encoder 22 mounted coaxially with a mechanical pointer 24. The shaft encoder 22 is effective for producing two pulse trains designated A and B in FIG. 1. The pulse trains are provided to delay and shaping circuits 26 and 28 and to a decoding network 30. The decoding network 30 determines whether an up count or a down count is being produced, i.e., whether the scale pointer 24 is rotating clockwise or counterclockwise.

From the decoding network 30, the up count and down count pulses are provided to range scaling networks 32 and 34, respectively. The range scaling networks multiply and/or divide the incoming pulses to scale the circuitry for the particular weight capacity of the mechanical scale 20. Thus, one range scaling operation would be performed for a full scale value of 5000 lbs. while a different scaling is necessary for a 20,000 lbs. capacity. From the range scaling networks the pulse trains for both the up and down count are provided to a tally counter 36 and to a dial scaling network 38. The tally counters 36 are preferably binary up/down counters. The dial scaling network 38 preferably utilizes BCD counters (binary coded decimal) in conjunction with a circuit which provides extra counts to the tally counter when the BCD counter reaches preselected count values. In this manner an adjustment is made so that the tally counter reaches its scale capacity value for a rotation of the pointer 24 of less than 360°. Dial scaling is necessary since the optical shaft encoder 22 is normally designed for 360° rotation, and in practice, most mechanical scales utilize less than full rotation. Typically full scale may be on the order of 346° and thus the dial scaling network must add enough counts so that at 346° the display indicates the scale capacity value.

From the tally counter 36 the data is provided via a parallel to serial converter 40 to a decimal counter 42, and if desired, to a digital computer 44. The counter 42 is of the seven-segment type for driving a digital display. In such case the decimal counter 42 is then provided via a buffer-driver 46 to a seven-segment digital display 48 of the Numatron type. In this manner a mechanical scale reading is translated into a digital signal suitable for use by a digital computer and for direct readout on a digital display panel. The digital display may be located remotely from the mechanical scale with the data transmitted over cable to a central collection point.

As indicated in FIG. 2, the optical shaft encoder 22 is mounted directly on the scale shaft so that rotation of the shaft rotates the optical encoder. In some environments, however, it is undesirable to provide the shaft encoder directly on the scale. This is particularly true when the scale is subject to excessive mechanical vibration as is the case in some asphalt batching plant operations. In that case, in place of the optical shaft encoder, a potentiometer is mounted to the scale shaft to produce a voltage proportional to the amount of rotation. In turn, this potentiometer is coupled to a servosystem which causes a motor to rotate by an amount equivalent to the scale shaft rotation. By locating the servosystem at a point remote from the scale, the excessive mechanical vibration is eliminated. The optical shaft encoder is connected to the servomotor. The advantage of this system is that by eliminating vibration the optical shaft encoder is not subjected to the severe vibration avoiding false data.

Referring now to FIG. 2A, the principles of operation of the optical shaft encoder 22 are illustrated. The shaft encoder 22 is of a type wherein a glass disc 50 having a plurality of transparent windows thereon rotates between a light source and a photosensor. As the disc alternately interrupts or passes light from the source to the photosensor, electrical signals are generated. Such optical encoders are commercially available and for example, the optical shaft encoder manufactured by Litton Industries, Model No. BIC 35-502G10, has been found satisfactory for the purposes of the present invention.

Figure 4:
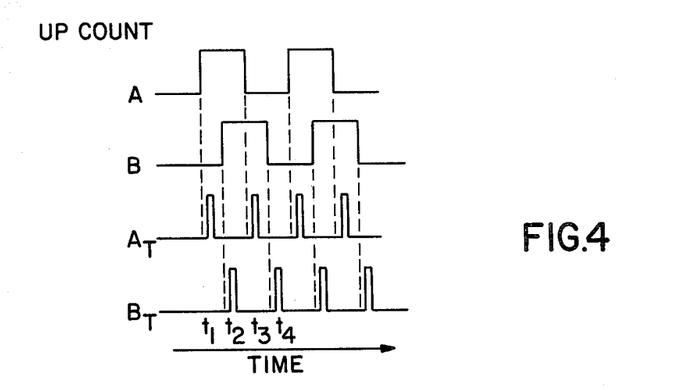
FIGS. 4 and 5 are wave form diagrams illustrating the relationship between the two pulse trains produced by the optical shaft encoder during an up count and a down count, respectively.

The optical shaft encoder has a rotatable disc 50. Provided on the disc are at least two rows of translucent or transparent windows 52 and 54. The balance of the disc is preferably opaque so that it will not pass light. A pair of light sources 56 and 58 are directed at the disc at a radius from the center corresponding to the location of the translucent windows 52 and 54, respectively. Situated behind the disc are a pair of photosensors 60 and 62. The windows 52 are displaced slightly from the row 54. Rotation of the disc permits the light sources 56 and 58 to strike the photosensors 60 and 62 whenever a window is aligned between a source and a sensor. The photosensors 60 and 62 produce an electrical current whenever light strikes their surface. Thus, by the rotation of the disc 50 a plurality of electrical pulses are produced, one set for the upper set of light windows 52 and a separate set for the lower windows 54. For discussion purposes the upper set of windows are designated the "A pulses" while the lower set are designated the "B pulses". The resulting output from the optical encoder is illustrated in FIG. 4 for an upward or clockwise rotation of the device and in FIG. 5 for a downward or counterclockwise rotation.

Figure 3:
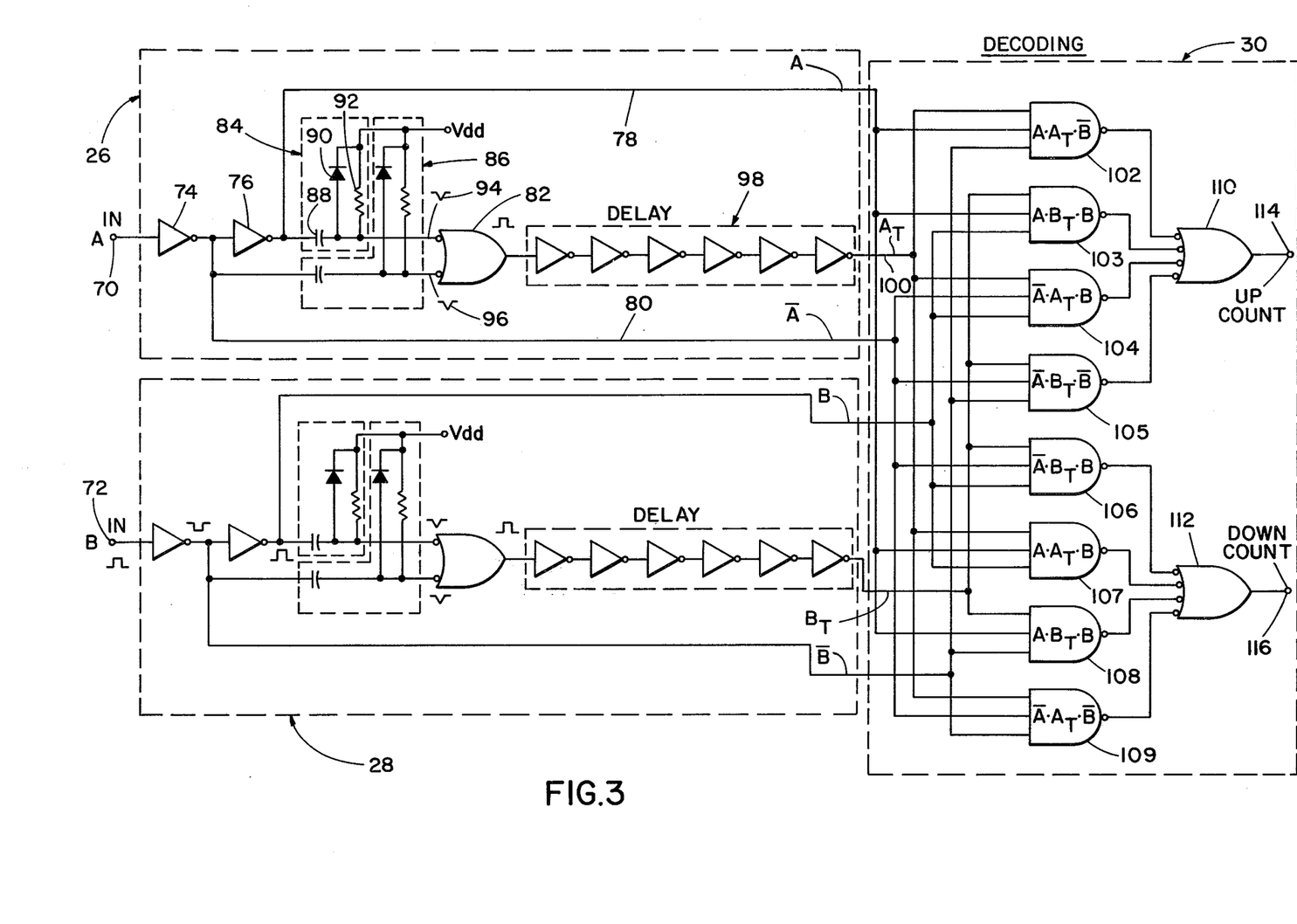
FIG. 3 is a schematic drawing of the delay and shaping network and the decoding network for the circuit of the present invention.

Referring now to FIG. 3, the delay and shaping circuits 26 and 28 and the decoding network 30 are illustrated. The A pulses are received at terminal 70 while the B pulses are received at terminal 72. Both delay and pulse shaping circuits 26 and 28 are identical; therefore only circuit 26 will be described, it being understood that the description applies equally to circuit 28. From terminal 70 the A pulses are passed through a pair of inverting amplifiers 74 and 76. The output of the amplifier 76 is provided to the decoding network 30 on line 78 and is of the same polarity as the original signal, having been twice inverted. From the output of amplifier 74, an inverted A pulse is provided to decoding network 30 on line 80.

The outputs from amplifiers 74 and 76 are also provided to the negative input OR gate 82 via edge decoupling networks 84 and 86 respectively.

The decoupling network 84 includes a capacitor 88 connected between the output of amplifier 76 and one of the negative inputs to OR gate 82. Connected to the input of the OR gate 82 is a diode 90 and a resistor 92, the other ends of these components being connected to a D.C. voltage supply. The edge decoupling network 86 is identical in construction. Each edge decoupling network is effective for producing a spike during one transition of the A pulse. That is, the decoupling network 84 produces a negative going spike on the trailing edge of the A pulse, while decoupling network 86 produces a negative going spike on the leading edge of the A pulse. The decoupling network operates to produce a spike as follows.

Assume that the capacitor 88 is in a discharged condition wherein both sides are at a positive voltage corresponding to the peak value of the A pulses. When the trailing edge of the A pulse occurs, the left side of the capacitor is pulled towards zero, forcing the right side to follow. As soon as this phenomenon occurs, the capacitor begins charging back up through resistor 92 from the D.C. voltage source until it is again at equilibrium, thus producing the spike wave form. The diode 90 is a spike clipper and prevents an excessive voltage on the capacitor 88 when the next pulse wave occurs. Use of two edge decoupling networks generates spikes 94 and 96 on both the positive and negative transitions of the A pulse.

Figure 5:
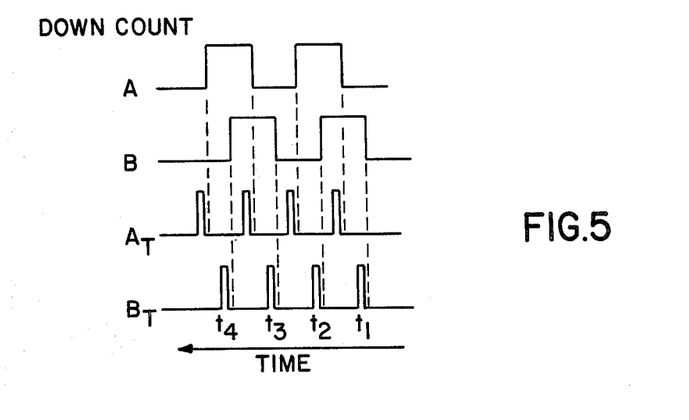

The spikes 94 and 96 are applied to the negative inputs of OR gate 82. The spikes are inverted and squared by the gate. The output of the OR gate is provided to a series of 6 inverting amplifiers 98 which function as a delay circuit. The output of the delay 98 is provided to the decoding network 30 on line 100. As illustrated in FIGS. 4 and 5, the output from the delay network 98 is the delayed square wave designated $A_T$. Similarly, the output from the lower delay circuit is $B_T$. These outputs are delayed and shaped transition pulses produced when the A and B pulses change levels.

As indicated in FIG. 3, the decoding network 30 comprises a matrix of NAND gates 102 through 109. These NAND gates are connected to receive various ones of the six input variables, namely A pulses, the B pulses, the inverted A and B pulses, and the $A_T$ and $B_T$ pulses. There are four conditions of the variables which indicate an up count (clockwise rotation of the scale). Each of these four conditions is gated through one of the NAND gates 102-105 to the negative input OR gate 110. Similarly, there are four combinations of variables which indicate a down condition (counterclockwise rotation of the scale) and these are provided via NAND gates 106–109 to the negative inputs of OR gate 112.

By comparing FIGS. 4 and 5 an understanding may be had as to why particular variable relationships indicate up or down conditions. Due to the arrangement of the transparent windows on the optical encoder the A pulse will occur first if the scale is rotating clockwise. In that case, when the $A_T$ pulse occurs, the B pulse will still be low. Thus, a first condition indicating an up count is given by the Boolian expression $A \cdot A_T \cdot \overline{B}$. This condition operates gate 102. At a later point in the up count the B pulse will go high producing $B_T$ after the delay caused by the delay circuit 98. Thus, an indication that the up count is continuing is given by the condition $A \cdot B_T \cdot B$. This condition operates gate 103. In a similar manner gates 104 and 105 are operated if the indicated conditions exist when the next $A_T$ and $B_T$ pulses occur.

The conditions indicated as operating the up count gates do not occur during a down count. (See FIG. 5) As soon as the scale pointer starts to rotate in the counterclockwise direction indicating a down count, the B pulse will lead the A wave form producing $B_T$ pulses before $A_T$ pulses. These conditions will not operate any of gates 102–105. The condition at time T1 in the down count, however, is effective for operating gate 106 which requires $\overline{A} \cdot B_T \cdot B$. Thus, the decoding circuit 30 differentiates between an increasing and a decreasing scale rotation. Due to the presence of the delay 98 there is a sufficient dead band to prevent false readings or chatter when the scale remains fixed at a given value.

Figure 6:
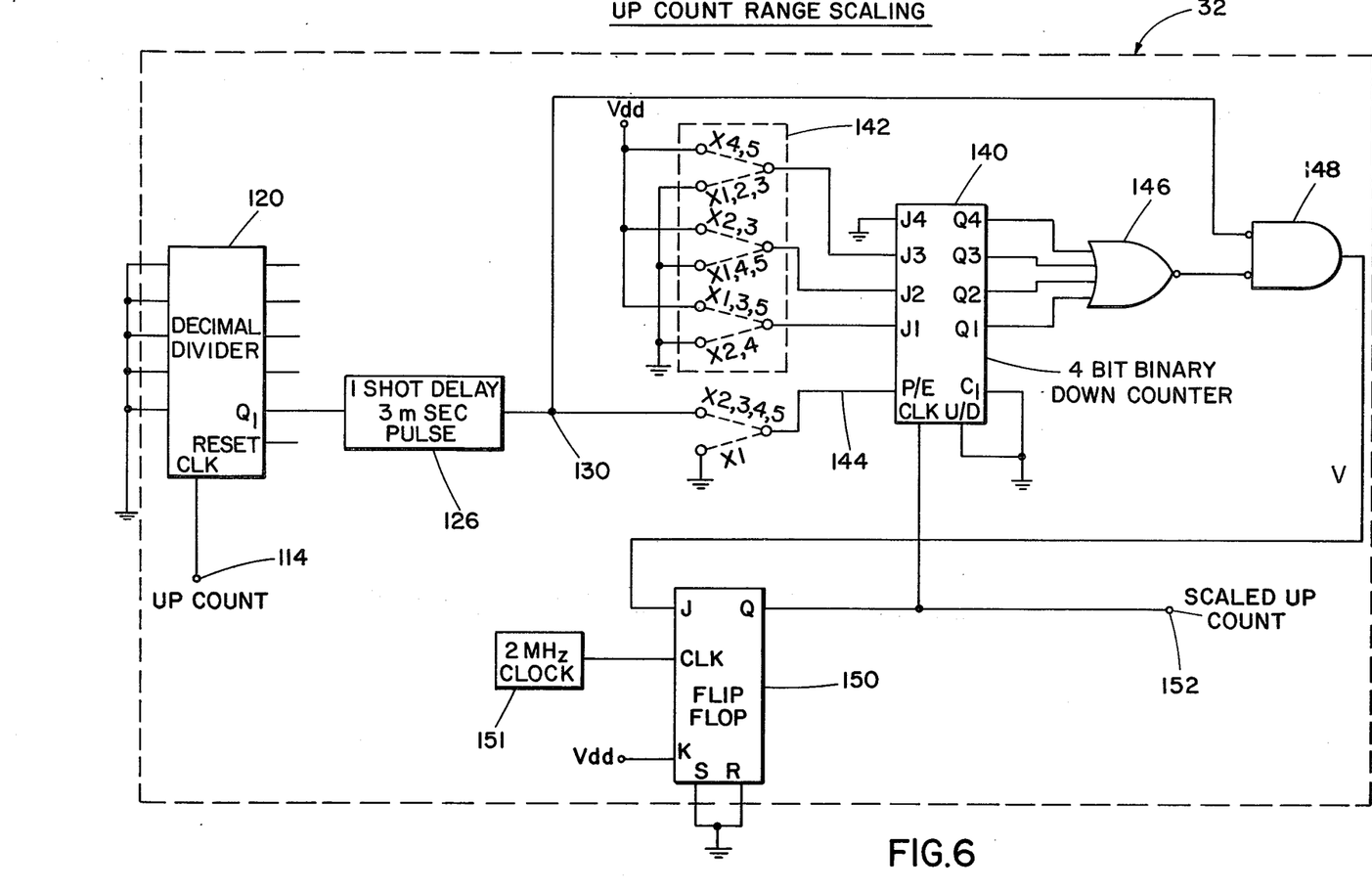
FIG. 6 is a schematic diagram of the range scaling circuit according to the present invention.

Having decoded the pulse trains from the optical encoder, an up count is provided via terminal 114 to the range scaling network 32 while the down count on terminal 116 is provided to the range scaling network 34. Networks 32 and 34 are identical and for brevity and simplicity, only one such circuit is illustrated in FIG. 6. This circuit is provided in order to permit a given optical shaft encoder to be utilized with many different scale capacities. That is, the optical shaft encoder provides a given number of pulses per complete revolution. Depending on the scale capacity, i.e., 5,000 lbs. or 50,000 lbs., the range scaling network is set to multiply and/or divide the pulses to produce an accurate readout at full scale. For the Litton Industries optical encoder referenced earlier, there are 10,000 A pulses per 360° revolution and 10,000 B pulses. Thus there are 20,000 pulses per 360° revolution. In order to determine the necessary range scaling for a selected capacity, the following equation is utilized:

$$\text{Scale size} = (\text{number of pulses}) \cdot Y/X$$

where:
scale size is the maximum capacity in pounds;
$X$ is a divisor; and
$Y$ is a multiplier.

Thus, for a known scale capacity the values X and Y can be selected to produce the required range scaling. For example, if the maximum scale capacity is 10,000 lbs., the equation would be:

$$10,000 = (20,000) \, Y/X$$

If the multiplier $Y$ is chosen as 1, the value of $X$ is 2; that is, the up count received must be divided by 2 in order to range scale the circuit for a 10,000 lb. maximum.

Referring now to FIG. 6, a decimal divider 120 receives the up count from terminal 114 at its clock input. This decimal divider is a commercially available product as for example, the divider manufactured by RCA Corporation having the part number CD4018. For a given input, the circuit can divide by even whole numbers less than 10. If necessary, of course, two or more such dividers could be placed in series to provide the capability of dividing by numbers greater than 10, and by appropriate gating of the output, odd divisors are easily produced.

Figure 6A:
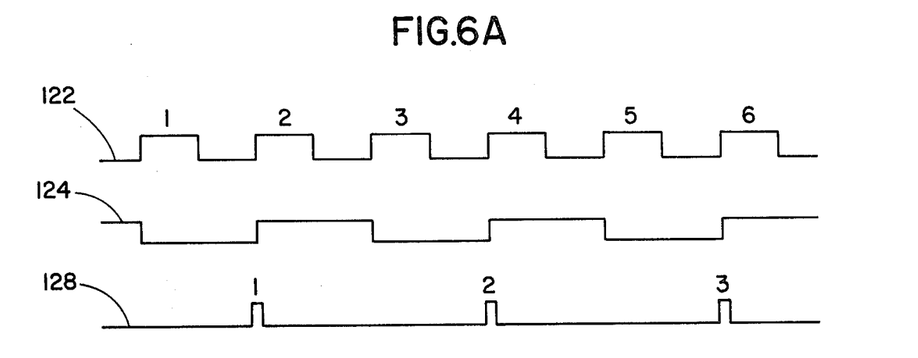
FIG. 6A is a wave form diagram illustrating the operation of the decimal divider forming a part of the range scaling circuit.

The operation of the decimal divider is illustrated in FIG. 6A wherein the up count applied to the divider is illustrated as wave form 122 and the output from the divider is illustrated as wave form 124. It will be seen that the divider produces an output pulse in this particular example every 2 pulses of the up count. Thus, it is performing a divide-by-2 function. Connected to receive the output from the decimal divider is a one-shot multi-vibrator 126. The one shot triggers only on positive transitions from the decimal divider as indicated in FIG. 6A. The output from the one shot is illustrated as wave form 128. It will thus be seen that a pulse is produced by the one-shot 126 for every 2 inputs to the divider 120. The output of the one-shot delay 126 is provided to terminal 130 which is the input to the multiplying stage of the range scaling network.

In situations where the scale capacity is such that the scaling cannot be accomplished by mere division, a combination of multiplication and division may be necessary. For example, if the scale capacity is 50,000 lbs., after dividing by 2, the up count would next be multiplied by 5, as may be verified by working through the equation given above. The incoming pulses are approximately 3 microseconds in duration, preferably, and are applied to the preset enable of a 4-bit binary counter 140. This counter may be of the type manufactured by RCA, for example CD4047. This counter has four jam inputs J1–J4 and four outputs Q1–Q4. The jam inputs are connected by means of a switching matrix 142 to ground or a positive source of voltage, depending upon the particular multiplier to be obtained. For example, to obtain a multiplier of 3 which in binary is 011, the J4 input would be grounded since it is not necessary. The J3 input is grounded to preset a 0 while the J2 and J1 inputs are connected to the positive voltage to provide a logical one at these inputs. Thus, the 4-bit binary counter has a binary 3 preset at its jam inputs. When the incoming pulse from the one-shot multi-vibrator 126 is applied to the preset enable on line 144, the number preset at the jam inputs is transferred to the Q outputs. For other multipliers, the respective jam inputs are connected to the matrix 142 so as to provide the binary equivalent of the desired multiplier. In the event that multiplication is unnecessary, the preset enable line 144 is connected to ground and the output is taken from terminal 130.

The four Q outputs from the adder 140 are connected to NOR gate 146 which in turn is connected to the negative input of AND gate 148. The other negative input to AND gate 148 are the pulses from the one shot 126. The output from AND gate 148 is connected to the J input of a JK flip-flop 150, the K input being connected to a voltage source. The Q output from the flip-flop 150 is used as the clock for the binary counter 140 and as the output from the range scaling circuit 32.

A 2 MHz clock 151 is utilized to clock the flip-flop 150. Considering the operation of the multiplier, the K terminal of the flip-flop 150 is tied to the voltage Vdd. Therefore, whenever the J input is 0, the flip-flop is maintained in its reset condition so that its Q output is 0. When the J input goes high, the flip-flop goes into a toggle condition. By "toggle" it is meant that the flip-flop alternately sets and resets on every other clock pulse so that the Q output is effectively a 1 MHz clock for a 2 MHz clock input. Toggling of flip-flop 150 is controlled from the AND gate 148 in a manner now to be described.

When an incoming pulse from the one-shot 126 is applied to the preset enable of the 4-bit counter 140, the binary number corresponding to the desired multiplier is transferred from the jam inputs to the Q outputs. As long as any of the Q outputs are high, i.e., a logical 1, NOR gate 146 is low. The low output from gate 146 applied to the inverting input of gate 148 causes gate 148 to go high as long as there is no pulse on terminal 130. This latter condition is imposed to prevent toggling of the flip-flop when the counter is being preset.

When gate 148 goes high, it initiates toggling of the flip-flop 150 so that its Q output produces the 1 MHz output. This output train is applied to the clock input of the binary counter 140 and is effective for counting down the binary number present at the Q outputs of counter 140. Thus, if a binary 3 (011) is initially present at the Q outputs, after the first clock pulse the Q outputs will be in the state (010). Gate 148 will remain high and further toggling will continue until the binary counter reaches 000, at which point gate 146 goes high causing gate 148 to go low, resetting flip-flop 150 to prevent further toggling. Thus, for each pulse into the multiplier from one-shot 126 a plurality of output pulses on line 152 are produced according to the number preset into the binary down counter 140. For example, if a binary 3 is preset into the down counter 140, an incoming pulse will cause the flip-flop to toggle three times, producing three output pulses on line 152. Thus, the incoming pulse is effectively multiplied by 3.

Figure 7:
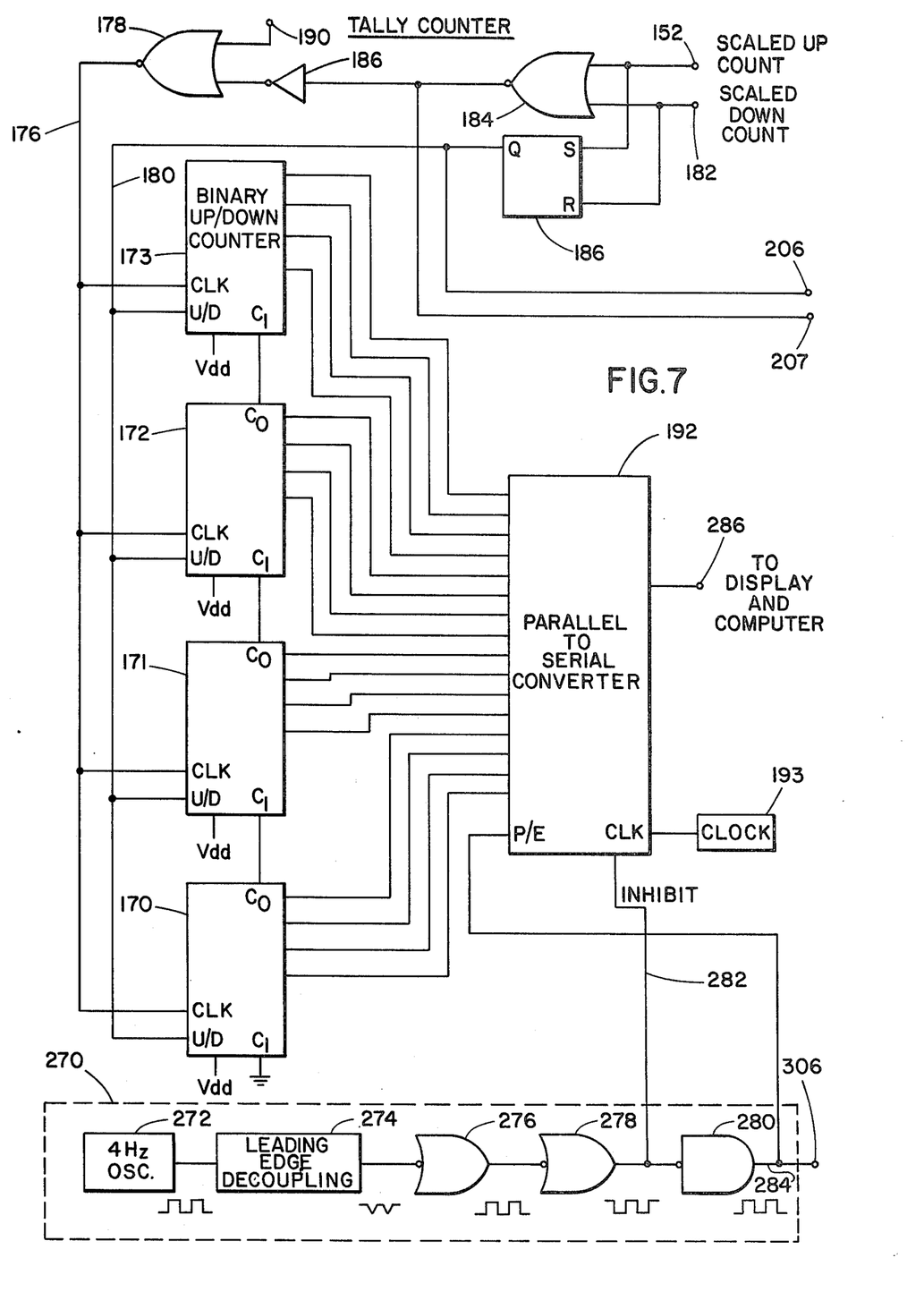
FIG. 7 is a schematic diagram of the tally counter and parallel to serial converter forming a part of the present invention.

Referring now to FIG. 7, the tally counter 36 and the parallel to serial converter 40 are illustrated. The tally counter comprises a set of four interconnected binary counters 170–173. It will be apparent that a greater or lesser number of binary counters can be utilized depending upon the application to which the invention is applied. The binary counters 170–173 are interconnected so that the carry from the counter 170 is provided as a carry input to the counter 171 and so on. The input to the counters is provided on line 176 from a NOR gate 178. The input is applied to the clock inputs of all four counters. However, no counter except the first can be clocked until the counter preceding it produces a high signal on its carryout. Thus, when the counters are initially at 0, counters 171–173 remain quiescent. When counter 170 overflows producing a carryout, counter 171 is enabled to receive the clock pulses on line 176 and so on up the string. Thus, for the four tally counters shown, there is a capability of counting from 0 through $2^{15}$ or approximately 65,000. These counters are up-down counters in that, depending on the logic state of the signal on line 180, the incoming pulse on line 176 will cause the counters to count up or down.

The input to the tally counter is provided on terminals 152 for the scaled upcount and terminal 182 for the scaled downcount. These counts are provided to a NOR gate 184 and to an RS flip-flop 186. The flip-flop 186 controls the logic state of the up-down line 180. The scaled upcount on terminal 152 is provided to the set terminal of the flip-flop 186 thereby producing a high Q output on line 180 when an upcount is being applied to the tally counters. In turn, this causes the binary counters 170–173 to count up. The downcount on terminal 182 is applied to the reset terminal of flip-flop 186, causing a low Q output on line 180 effective for causing the counters to count down. The count applied to the tally counters via line 176 is a combination of the pulses received from the NOR gate 184 via inverting amplifier 186 and pulses supplied to terminal 190 from the circuit of FIGS. 8A and 8B.

As thus far described, the tally counter receives a pulse train from either the scaled upcount or downcount and through a series of logic gates applies it via line 176 to the binary counters, which count each pulse. The 16 parallel outputs from the four binary counters 170–173 are provided to a parallel to serial converter 192. The parallel to serial converter receives the sixteen inputs from the tally counters and produces a serial output representative of the value the counters have reached. Before describing the parallel to serial conversion and the subsequent display circuitry, the operation of the dial-size scaling network of FIGS. 8A and 8B will be considered.

Figure 8A:
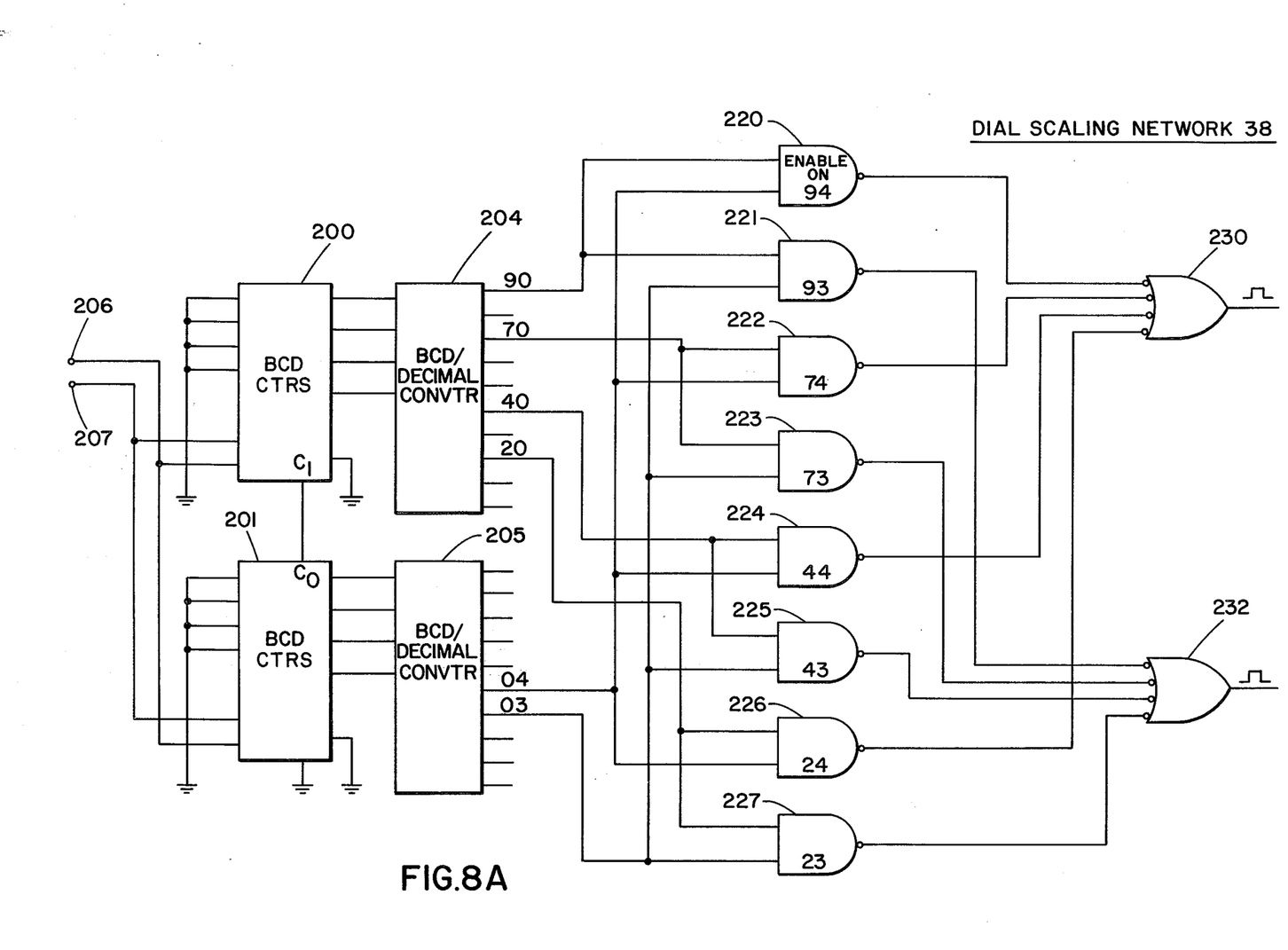
FIGS. 8A and 8B are schematic diagrams of the dial scaling network forming a portion of the present invention.
Figure 8B:
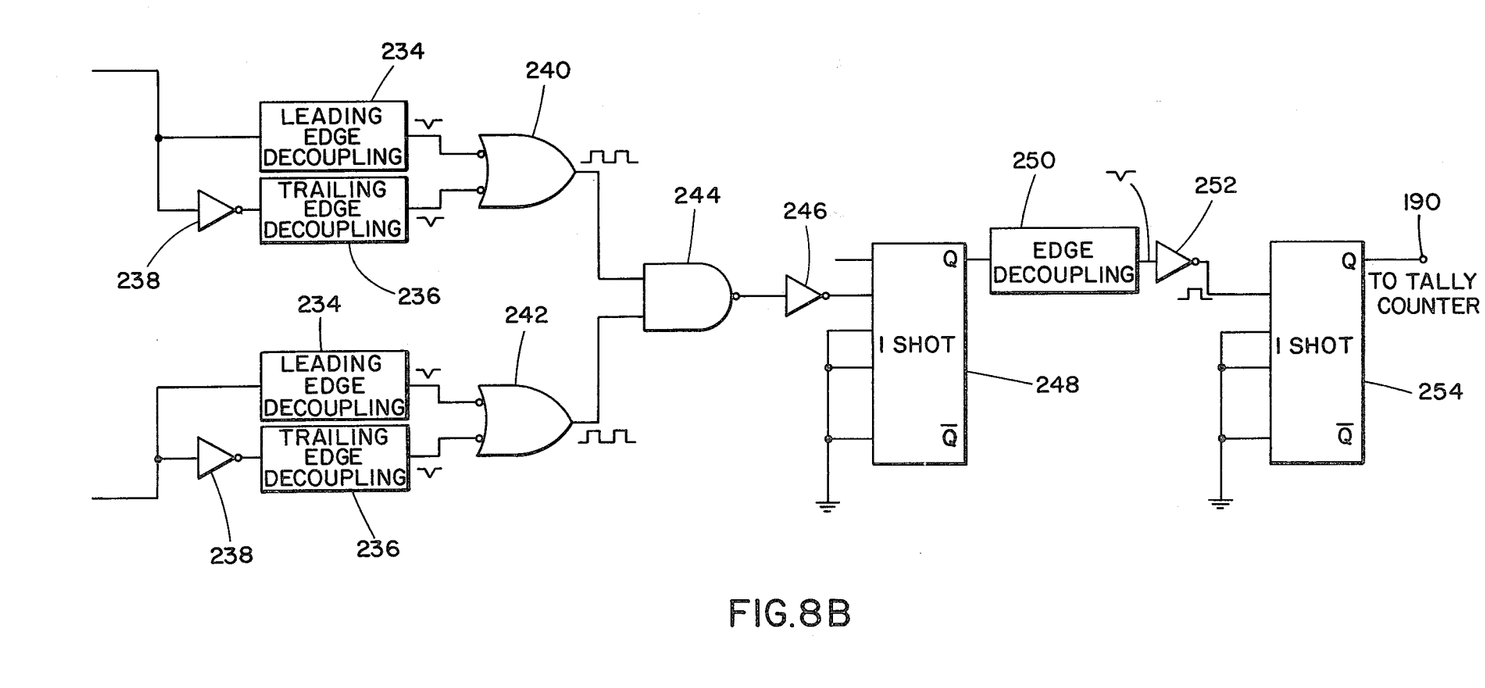

The dial scaling network 38 is illustrated in FIGS. 8A and 8B. The network includes a pair of binary coded decimal (BCD) counters 200 and 201, the outputs of which are provided to BCD to decimal decoders 204 and 205. The inputs to the BCD counters are provided on terminals 206 and 207 from the tally counter circuit illustrated in FIG. 7. The input on terminal 207 is the scaled up or down count inverted by the NOR gate 184, while the input on terminal 206 is the logic state of the flip-flop 186, indicating whether the counters should count up or down in response to the signals on line 207. As will be apparent, the BCD counters 200 and 201 are connected in parallel with the binary counters so that they count up and down along with the tally counters. Only two BCD counters are required since, as will be explained, it is only necessary for them to have a maximum capacity of 99.

Recalling the purpose of the dial scaling network 38, it will be remembered that the optical encoder is calibrated to produce a full scale reading for a 360° revolution of the mechanical scale to which it is coupled. As previously stated, most scales do not utilize a 360° revolution from zero value to the full scale reading. Thus, in order to compensate for the smaller angular displacement of a scale, it is necessary to add or subtract a certain number of pulses from the tally counter in order to obtain an accurate digital representation of the scale value. The number of counts to be added or subtracted depends upon the angular value of the full scale rotation of the particular scale being utilized. This requirement may be stated mathematically as:

$$\left[\frac{360 - X}{360}\right] [100 \text{ counts}] = EC$$

where EC = number of extra counts per 100 counts and X = full scale rotation of scale in degrees. In the present embodiment illustrated in FIGS. 8A and 8B, a scale rotation of 346.15 is being accommodated. Using this value into the above equation, a solution of approximately four extra counts per hundred counts must be added to or subtracted from the tally counter.

In order to add or subtract these extra counts, the scaling network FIGS. 8A and 8B is utilized. The BCD counters parallel the tally counters as stated and for every 100 counts up or down, four additional counts are generated by this network and applied to terminal 190 of FIG. 7. The extra counts are generated by coupling selected outputs of the binary to decimal converters 204 and 205 to a network of NAND gates 220 227. As may be readily appreciated, the outputs from converter 204 represent the tens digit, while the outputs from the converter 205 represent the ones digit. Thus, as illustrated in FIG. 8A, gate 220 is connected to enable on a count of 94 while gate 221 is connected to enable on 93, gate 222 on 74, gate 223 on 73, etc. The particular counts on which the gates enable are arbitrarily selected so that the extra counts are spaced over the hundred count range. Thus, starting from zero, two gates will enable at 23 and 24, another pair will enable on 43 and 44, another at 73 and 74, and the last pair at 93 and 94.

Gates 220, 222, 224 and 226 are connected to the negative inputs of OR gate 230, while the remaining NAND gates are connected to the negative inputs of OR gate 232. The output of the OR gates 230 and 232 are provided to edge decoupling networks 234 and 236; the decoupling network 236 receiving an inverted output due to inverting amplifier 238. The outputs from the edge decoupling networks 234 and 236 are provided to the negative input of OR gate 240 for the upper portion of the circuit and OR gate 242 for the lower portion of the circuit. The outputs of these gates are proved to NAND gate 244. As will be appreciated from a study of the logic just described, an output from gate 244 is produced only when the output from both OR gates 240 and 242 are simultaneously high. This insures the condition wherein the count is progressing in an up or down sequence. Thus, in order to produce a low output from NAND gate 244, it is necessary that the count reach 23 and 24 without stopping or changing direction in order to produce a first pulse, reach 43 and 44 to produce a second pulse, and so on up the matrix of NAND gates 220–227. This prevents false counts in the circuit by providing a dead band.

Thus an output is obtained from gate 244 when the outputs from gates 240 and 242 are both high indicating a change from a three state to a four state, i.e., 23 to 24, 43 to 44, etc. The low output from gate 244 is inverted by amplifier 246 and applied to a one-shot 248. One-shot 248 produces a pulse of approximately ten microseconds duration, which is supplied to another edge decoupling network 250 identical in construction to that illustrated and described in FIG. 3. An inverting amplifier 252 shapes and inverts the polarity of the spike thus produced and applies it to a further one-shot 254, producing an output pulse of approximately one microsecond. The output from this one-shot is provided to terminal 190 of FIG. 7 and constitute the additional pulses added by the dial scaling network to the tally counter.

Summarizing the operation of the scaling network of FIGS. 8A and 8B, a pair of BCD counters are employed to count in parallel with the tally counters. These BCD counters have their output converted to decimal, and through a gating network, a preselected number of pulses are generated during the counting process. These pulses are connected by further logic to insure that the counting sequence continues in the direction in which it has begun, and when this is assured, the required additional pulses are generated by the one-shot multi-vibrator and supplied to the tally counter.

Referring again to FIG. 7, the parallel to serial converter 192 and the associated logic will be described. The parallel to serial converter 192 receives sixteen inputs, four from each of the binary counters 170–173. In response to the parallel input from the tally counters the converter produces a sequence of pulses equal to the binary number received from the tally counter. The parallel to serial converter is constructed in the manner shown and described for the multiplier circuit of FIG. 6. That is, the sixteen inputs represent a binary number which is utilized to preset the converter. The converter is then downcounted from the preset number represented by the sixteen parallel input lines through the operation of a toggling flip-flop at a clock rate one-half the applied clock 193 which preferably operates at 2 MHz.

A timing and initializing circuit 270 is provided for initializing the display counters 42 and for inhibiting operation of the parallel to serial converter 40 until the tally count data is preset into the converter. Circuit 270 includes a 4 Hz oscillator 272, a leading edge decoupling circuit 274 of the same construction as the decoupling circuits previously described, inverting gates 276, 278 and 280. The output from the timing circuit 270 on line 282 is applied to the parallel to serial converter to inhibit operation during the times when data is not preset on the input lines to the converter. The output on line 284 is utilized to initialize the display counters 42 and to preset the data from the input of the parallel to serial converter to the output of the downcounters utilized by the converter.

Thus, in the manner shown and described for the multiplier circuit, the parallel to serial converter receives a binary number on the sixteen input lines and produces a serial output on terminal 286. The output is generated at a 1 MHz clock rate and is a series of pulses equal to the binary number provided on the sixteen parallel input lines to the converter. The converter is reset 4 times per second by the circuit 270.

Figure 9:
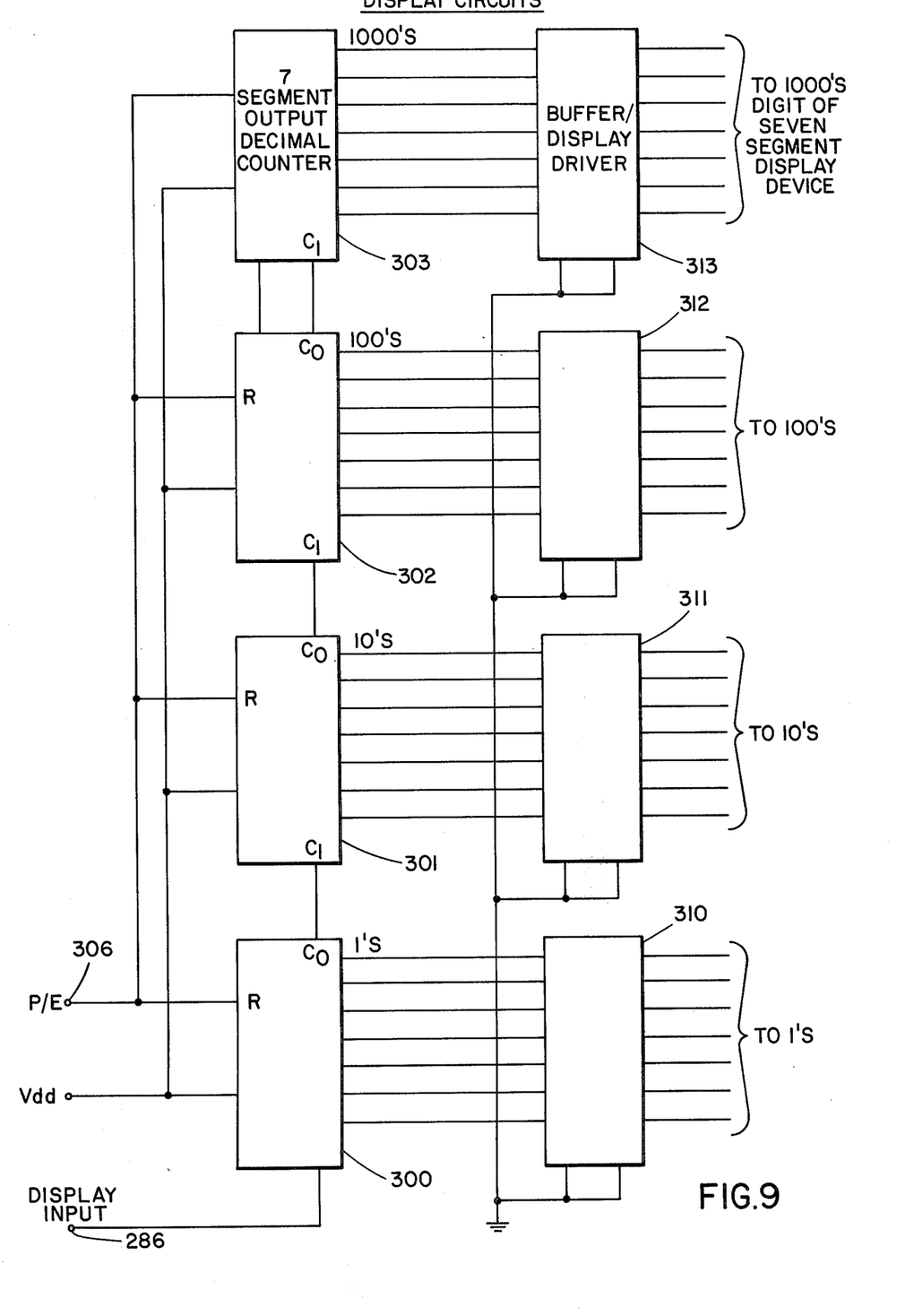
FIG. 9 is a schematic diagram of the seven-segment counters and buffer drivers for the digital display.

The output of the parallel to serial converter 192 is provided to the seven-segment decimal counters 42 and if desired to a general purpose computer 44. The seven-segment counters are illustrated in FIG. 9. Four seven-segment decimal counters 300–303 are interconnected in the usual manner so that the counter 300 keeps track of the ones digit, the counter 301 the tens digit, and so on, until counter 303, which keeps track of the thousands digit. The input to the counters is provided to counter 300 on terminal 286 from the parallel to serial converter 192. The serial input pulses are counted by the seven-segment counters, which are initialized just prior thereto by an output pulse from the timing circuit 270 applied to terminal 306. The pulse applied to terminal 306 resets the counters to zero in preparation for each new counting sequence. The output from each seven-segment counter is provided to one of the buffer/display drivers 310–313. From the buffer/drivers the outputs are applied to a seven-segment display device such as a Numatron display tube.

The seven-segment counters illustrated in FIG. 9 as well as the buffer/display drivers are standard items available in the art. For example, the seven-segment output decimal counters may be of the type manufactured by RCA Corporation and designated CD4033. Such counters receive a serial input and count it decimally. The output is provided on selected ones of the seven output lines which, when applied to a seven-segment display device, form the decimal number to which the counter is set.

OPERATION

While an attempt has been made to summarize the operation of each segment of the circuit as it was described, a brief over-all description of the circuit operation will now be given. From an optical shaft encoder preferably mechanically connected to the shaft of a scale, a pair of pulse trains are generated. One of the pulse trains lags the other pulse train, permitting a determination of whether the scale is beng rotated upwardly or downwardly, through the use of the decoding network 30. After a determination has been made as to the direction of the scale, the range scaling circuits 32 or 34 are employed to multiply and/or divide the number of pulses from the initial pulse train to accommodate a selected maximum scale capacity. The scaled pulse count is then fed to a tally counter 36 and to a dial scaling circuit 38.

The dial scaling circuit is effective for adding and subtracting a predetermined number of extra pulses per hundred counts to adjust for a scale face which rotates less than 360° from the zero reading to the maximum scale value. The modified count is then provided to a parallel to serial converter 40 which receives the parallel data from the tally counter and converts it into serial format for application to the seven-segment counters 42 and for usage by a computer 44. The seven-segment counters supply their output to buffer drivers 46 which in turn operate seven-segment digital displays 48.

While I have shown and described an embodiment of this invention in some detail, it will be understood that this description and illustration are offered merely by way of example, and that the invention is to be limited in scope only by the appended claims.

I claim:
1. A circuit for converting angular rotation of a mechanical shaft to which an optical shaft encoder is coupled into an electronic signal representative of the amount and direction of said rotation comprising:
   a. delay means receiving electrical pulses from said encoder for generating timing pulses on the transitions of said encoder pulses, said delay means including:
      i. circuit means for generating a spike waveform on the leading and trailing edges of said encoder pulses; and
      ii. logic means for shaping said spike waveforms and providing a selected delay to thereby produce said timing pulses;
   b. decoding means receiving said timing pulses and the encoder pulses for producing an up count representative of rotation in a first direction and a down count representative of shaft rotation in the opposite direction;
   c. range scaling means for scaling the up and down counts from said decoding means to accommodate a selected maximum value;
   d. a tally counter for counting the scaled up and down counts;
   e. dial scaling means for producing a predetermined number of extra up and down counts, said extra counts being supplied to said tally counter thereby to adjust the output from said tally counter for a preselected maximum angular rotation of said shaft; and
   f. output means receiving the output from said tally counter for producing said electronic signal.

2. The circuit of claim 1 wherein said optical shaft encoder is directly coupled to said mechanical shaft.

3. The circuit of claim 1 wherein said optical shaft encoder is coupled to said mechanical shaft through an electromechanical servo system.

4. The circuit of claim 1 wherein said mechanical shaft is the pointer shaft of a mechanical weigh scale.

5. The circuit according to claim 1 wherein two electrical pulse trains are generated by said shaft encoder and a separate delay means is provided for each pulse train.

6. The circuit according to claim 1 wherein said decoding means includes:
   a. a plurality of logic gates each adapted to produce an output upon the occurence of a different selected binary logic relationship between said timing pulses and said encoder pulses, said binary logic relationships indicating the direction of rotation of said shaft;
   b. first means receiving the output of the logic gates whose selected logic relationship represents rotation in a first direction for producing said up count; and
   c. second means receiving the output of the logic gates whose selected logic relationship represent rotation in the opposite direction for producing said down count.

7. The circuit according to claim 1 wherein said range scaling means includes a pair of circuits, one for the up count and one for the down count, said circuits each comprising:
   a. means for dividing the up or down count by an integer; and
   b. means for multiplying the divided up or down count by another integer.

8. The circuit according to claim 7 wherein said multiplying means includes:
   a. a down counter receiving the divided up or down count;
   b. means for presetting said down counter to the integer by which the up or down count is to be multiplied each time a divided up or down count is received by said down counter; and
   c. means for producing clock pulses to cause said down counter to count down from the preset integer to zero upon the receipt of each divided up or down count, said clock pulses constituting said scaled up or down counts.

9. The circuit according to claim 8 wherein said means for producing clock pulses includes a flip-flop adapted to toggle between a set and reset condition whenever said down counter is at a value greater than said toggling being utilized to clock said down counter.

10. The circuit according to claim 1 wherein said tally counter includes:
   a. a plurality of interconnected up-down counters; and
   b. circuit means for causing said up-down counters to count up in response to said up count and down count in response to said down count.

11. A circuit for converting angular rotation of a mechanical shaft to which an optical shaft encoder is coupled into an electronic signal representative of the amount and direction of said rotation comprising:
  a. delay means receiving electrical pulses from said encoder for generating timing pulses on the transitions of said encoder pulses;
  b. decoding means receiving said timing pulses and the encoder pulses for producing an up count representative of rotation in a first direction and a down count representative of shaft rotation in the opposite direction;
  c. range scaling means for scaling the up and down counts from said decoding means to accommodate a selected maximum value;
  d. a tally counter for counting the scaled up and down counts;
  e. dial scaling means for producing a predetermined number of extra up and down counts, said extra counts being supplied to said tally counter thereby to adjust the output from said tally counter for a predetermined maximum angular rotation of said shaft, wherein said dial scaling means includes
    i. a second counter adapted to count up and down in parallel with said tally counter; and
    ii. a plurality of logic gates connected to said second counter, each gate adapted to enable when said second counter reaches a different predetermined value, the enabling of said gates producing said extra up and down counts;
  f. output means receiving the output from said tally counter for producing said electronic signal.

12. The circuit according to claim 11 wherein said second counter has a predetermined count capacity less than said tally counter and the number of said logic gates equals the number of extra counts required for the predetermined count capacity.

13. The circuit according to claim 12 wherein said logic gates are connected to enable at count values substantially equally distributed over the predetermined counter capacity of said second counter.

14. The circuit according to claim 13 wherein said second counter capacity is 100 counts.

15. A circuit for converting angular rotation of a mechanical shaft to which an optical shaft encoder is coupled into an electronic signal representative of the amount and direction of said rotation comprising:
  a. delay means receiving electrical pulses from said encoder for generating timing pulses on the transitions of said encoder pulses;
  b. decoding means receiving said timing pulses and the encoder pulses for producing an up count representative of rotation in a first direction and a down count representative of shaft rotation in the opposite direction;
  c. range scaling means for scaling the up and down counts from said decoding means to accommodate a selected maximum value;
  d. a tally counter for counting the scaled up and down counts;
  e. dial scaling means for producing a predetermined number of extra up and down counts, said extra counts being supplied to said tally counter thereby to adjust the output from said tally counter for a predetermined maximum angular rotation of said shaft;
  f. output means receiving the output from said tally counter for producing said electronic signal, said output being in parallel, said output means including means for converting the tally counter output to a serial format, said output means also including
    i. decimal counters receiving the serial output from said converting means and producing a seven-segment output in response thereto; and
    ii. electro-optical display means receiving said seven-segment output and producing a digital display of the numerical information represented by said seven-segment output.

16. The circuit according to claim 15 wherein said converting means includes means for timing the operating of said converter means and for periodically initializing said display means.

* * * * *